United States Patent
Gluschenkov et al.

(10) Patent No.: US 9,151,781 B2
(45) Date of Patent: Oct. 6, 2015

(54) YIELD ENHANCEMENT FOR STACKED CHIPS THROUGH ROTATIONALLY-CONNECTING-INTERPOSER

(75) Inventors: Oleg Gluschenkov, Tannersville, NY (US); Muthukumarasamy Karthikeyan, Fishkill, NY (US); Yunsheng Song, Poughkeepsie, NY (US); Tso-Hui Ting, Stormville, NY (US); Richard P. Volant, New Fairfield, CT (US); Ping-Chuan Wang, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 904 days.

(21) Appl. No.: 13/397,781

(22) Filed: Feb. 16, 2012

(65) Prior Publication Data
US 2012/0146682 A1    Jun. 14, 2012

Related U.S. Application Data

(62) Division of application No. 12/574,264, filed on Oct. 6, 2009, now Pat. No. 8,159,247.

(51) Int. Cl.
| | |
|---|---|
| *G01R 31/26* | (2014.01) |
| *H01L 23/58* | (2006.01) |
| *G01R 1/073* | (2006.01) |
| *H01L 21/66* | (2006.01) |
| *H01L 25/00* | (2006.01) |

(52) U.S. Cl.
CPC ............ *G01R 1/07378* (2013.01); *H01L 22/14* (2013.01); *H01L 22/20* (2013.01); *H01L 25/50* (2013.01); *H01L 2225/06596* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 4,907,062 | A | 3/1990 | Fukushima |
| 5,128,732 | A | 7/1992 | Sugahara et al. |

(Continued)

FOREIGN PATENT DOCUMENTS

| | | |
|---|---|---|
| JP | 61093613 A2 | 5/1986 |

OTHER PUBLICATIONS

Koyanagi, M. et al., "Three-Dimensional Integration Technology Based on Wafer Bonding with Vertical Buried Interconnections" IEEE Transactions on Electron Devices (Nov. 2006) pp. 2799-2808, vol. 53, No. 11.

(Continued)

*Primary Examiner* — Jermele M Hollington
(74) *Attorney, Agent, or Firm* — Scully, Scott, Murphy & Presser, P.C.; Catherine Ivers, Esq.

(57) ABSTRACT

A set of first substrate and second substrate are manufactured with a built-in N-fold rotational symmetry around the center axis of each substrate, wherein N is an integer greater than 1. A set of N different interposers is provided such that an i-th interposer provides electrical connection between the first substrate and the second substrate with a rotational angle of $(i-1)/N \times 2\pi$. The first and second substrates are tested with each of the N different interposers therebetween. Once the rotational angle that provides the highest stacked chip yield is determined, the first and the second substrates can be bonded with an azimuthal rotation that provides the highest stacked chip yield.

20 Claims, 10 Drawing Sheets

(56) References Cited

U.S. PATENT DOCUMENTS

| | | |
|---|---|---|
| 5,177,594 A | 1/1993 | Chance et al. |
| 5,214,657 A | 5/1993 | Farnworth et al. |
| 5,229,917 A | 7/1993 | Harris et al. |
| 5,773,315 A | 6/1998 | Jarvis |
| 6,661,086 B2 | 12/2003 | Zelsacher |
| 6,750,672 B2 | 6/2004 | Tanimura et al. |
| 6,821,826 B1 | 11/2004 | Chan et al. |
| 6,943,067 B2 | 9/2005 | Greenlaw |
| 6,975,016 B2 | 12/2005 | Kellar et al. |
| 7,037,804 B2 | 5/2006 | Kellar et al. |
| 7,087,464 B2 | 8/2006 | Yu et al. |
| 7,488,630 B2 | 2/2009 | Frank et al. |
| 7,537,959 B2 | 5/2009 | Lee et al. |
| 7,562,686 B2 | 7/2009 | Best et al. |
| 8,119,527 B1 * | 2/2012 | Chadrashekar et al. ...... 438/685 |
| 8,159,247 B2 * | 4/2012 | Gluschenkov et al. .. 324/754.09 |
| 2011/0080189 A1 * | 4/2011 | Gluschenkov et al. .. 324/762.02 |
| 2014/0184003 A1 * | 7/2014 | Kiesewetter et al. .... 324/754.03 |

OTHER PUBLICATIONS

Koester, S.J. et al., "Wafer-Level 3D Integration Technology" IBM Journal of Research and Development (Nov. 2008) pp. 583-597, vol. 52, No. 6.

\* cited by examiner

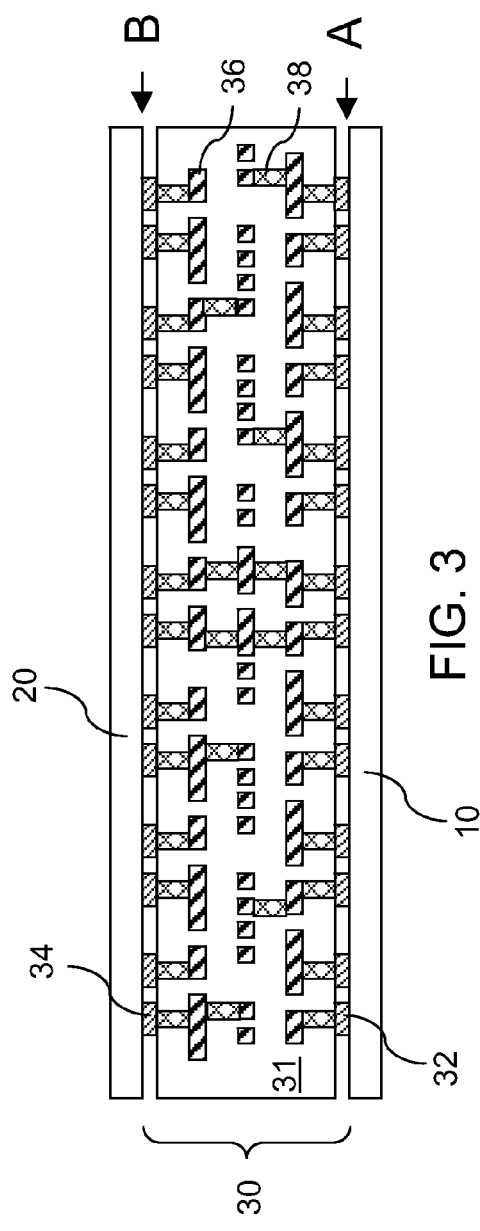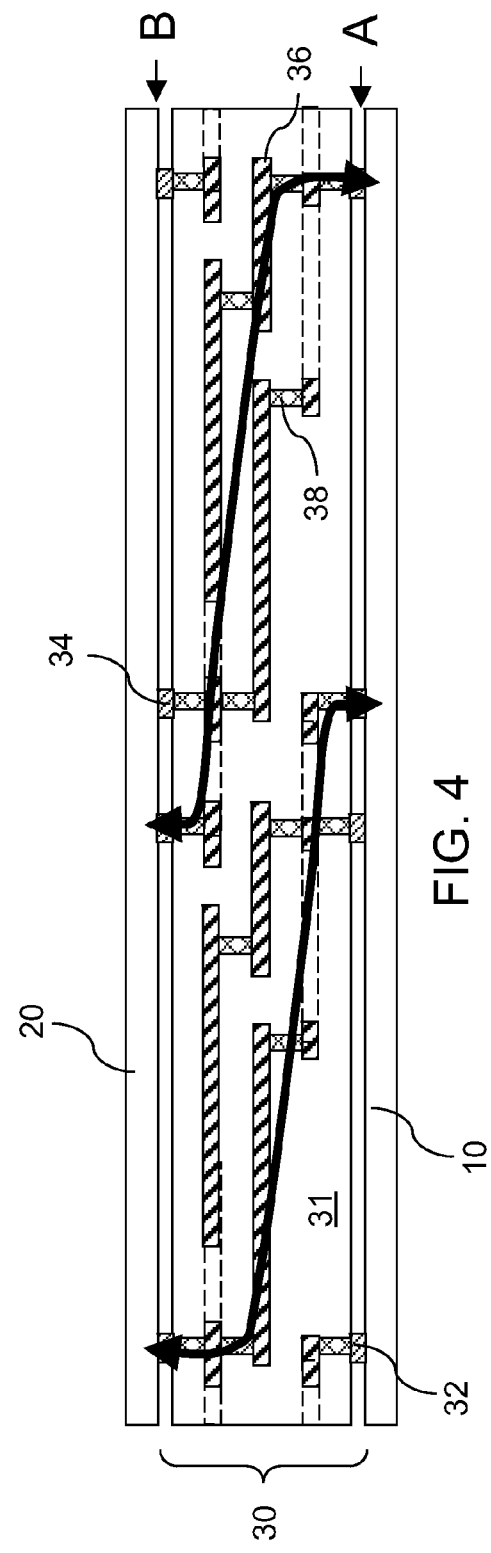

YIELD ENHANCEMENT FOR STACKED CHIPS THROUGH ROTATIONALLY-CONNECTING-INTERPOSER

CROSS REFERENCE TO RELATED APPLICATION

This application is a divisional of U.S. patent application Ser. No. 12/574,264, filed Oct. 6, 2009 now U.S. Pat. No. 8,159,247 the entire content and disclosure of which is incorporated herein by reference.

BACKGROUND

This invention relates to a method of testing semiconductor chips in multiple stacked configurations with different rotational interconnections and optimizing a stacked chip yield.

Bonding of multiple substrates is required to enable three-dimensional integration of semiconductor chips. Two semiconductor substrates are processed independently, and subsequently brought into physical contact with each other so that one chip in one substrate overlies another chip in another substrate. The functionality of each stacked chip requires functionality of each individual chip within the stacked chip.

Referring to FIG. 1, a commonly encountered situation in manufacturing of stacked semiconductor chips is schematically illustrated. A first wafer has a high yield area, which is herein referred to as a "first wafer high yield area," and a low yield area, which is herein referred to as a "first wafer low yield area." Also, second wafer has a high yield area, which is herein referred to as a "second wafer high yield area," and a low yield area, which is herein referred to as a "second wafer low yield area."

Because semiconductor chips in each wafer are patterned in the same orientation, the first wafer and the second wafer must be bonded with a unique predetermined azimuthal orientation relative to each other. For example, the requirement for functional bonding between the first and second substrates may be that the notch of the first wafer matches the notch of the second wafer when bonded. In general, once a first wafer and a second wafer to be bonded are determined, there is a one-to-one correspondence between chips on the first substrate and chips on the second substrate. The first and second wafers cannot be expected to produce functional stacked chips if bonded with a relative rotation.

Because the distribution of high yield areas and low yield areas are statistical, the first wafer high yield area may overlie the second wafer low yield area upon bonding, and the first wafer low yield area may overlie the second wafer high yield area upon bonding. In such a case, the yield of the stacked chips is low across the entire bonded structure because the functionality of a stacked chip requires functionality of both an upper chip from the first wafer and a lower chip from the second wafer.

BRIEF SUMMARY

In an embodiment of the present invention, a first substrate and a second substrate are manufactured with a built-in N-fold rotational symmetry around the center axis of each substrate. N is an integer greater than 1. A set of N different interposers is provided such that an i-th interposer provides electrical connection between the first substrate and the second substrate with a rotational angle of $(i-1)/N \times 2\pi$. The first and second substrates are tested with each of the N different interposers therebetween. Once the rotational angle that provides the highest stacked chip yield is determined, the first and the second substrates can be bonded with an azimuthal rotation that provides the highest stacked chip yield.

According to an aspect of the present invention, an apparatus for testing substrates in multiple configurations is provided. The apparatus includes a set of N interposers and a tester. An i-th interposer among the set of N interposers electrically connects a first selected chip located in a first area of a first substrate to a second selected chip in a second area of a second substrate for each integer i from 1 to N. The second area corresponds to an area that is rotated from the first area by an angle of $(i-1)/N \times 2\pi$ about a center axis of the first substrate. N is an integer greater than 1. The tester is configured to hold an assembly of the first substrate, the second substrate, and any one of the set of N interposers and to test a functionality of a combination of the first selected chip and the second selected chip for each of the set of N interposers.

According to another aspect of the present invention, another apparatus for testing substrates in multiple configurations is provided. The apparatus includes a tester and a rotational assembly. The tested is configured to hold an assembly of a first substrate, a second substrate, and an interposer therebetween and to test a functionality of a combination of a first selected chip located in a first area of a first substrate and a second selected chip in a second area of a second substrate. The second selected chip overlies or underlies the first selected chip. The rotational assembly is configured to rotate the second substrate by an angle of $1/N \times 2\pi$ about a center axis of the second substrate at least $(N-1)$ times. N is an integer greater than 1.

According to yet another aspect of the present invention, a method of testing substrates in multiple configurations is provided. The method includes providing a first substrate including first semiconductor chips and a second substrate including second semiconductor chips; providing N interposers including i-th interposers; and testing, employing each of the N interposers, combinations of a first selected chip that is selected from the first semiconductor chips and a second selected chip that is selected from the second semiconductor chips. N is an integer greater than 1, and i is an integer from 1 to N. The second selected chip is located in a second area that is rotated from a first area of the first selected chip by an angle of $(i-1)/N \times 2\pi$ about a center axis of the first substrate for each of the i-th interposers.

According to still another aspect of the present invention, another method of testing substrates in multiple configurations is provided. The method includes testing an assembly of a first substrate, a second substrate, and an interposer therebetween and to test a functionality of a combination of a first selected chip located in a first area of a first substrate and a second selected chip in a second area of a second substrate, wherein the second selected chip overlies or underlies the first selected chip; rotating the second substrate by an angle of $1/N \times 2\pi$ about a center axis of the second substrate $(N-1)$ times; and repeating the testing of the assembly of the first substrate, the second substrate, and the interposer after each rotation of the second substrate.

BRIEF DESCRIPTION OF THE SEVERAL VIEWS OF THE DRAWINGS

FIG. 3 is a vertical cross-sectional view of the first exemplary structure along the plane X-X' in FIG. 2 according to the first embodiment of the present invention.

FIG. 4 is a vertical cross-sectional view of the first exemplary structure along a curved plane Y-Y' in FIG. 2 according to the first embodiment of the present invention.

DETAILED DESCRIPTION

Figure 1:
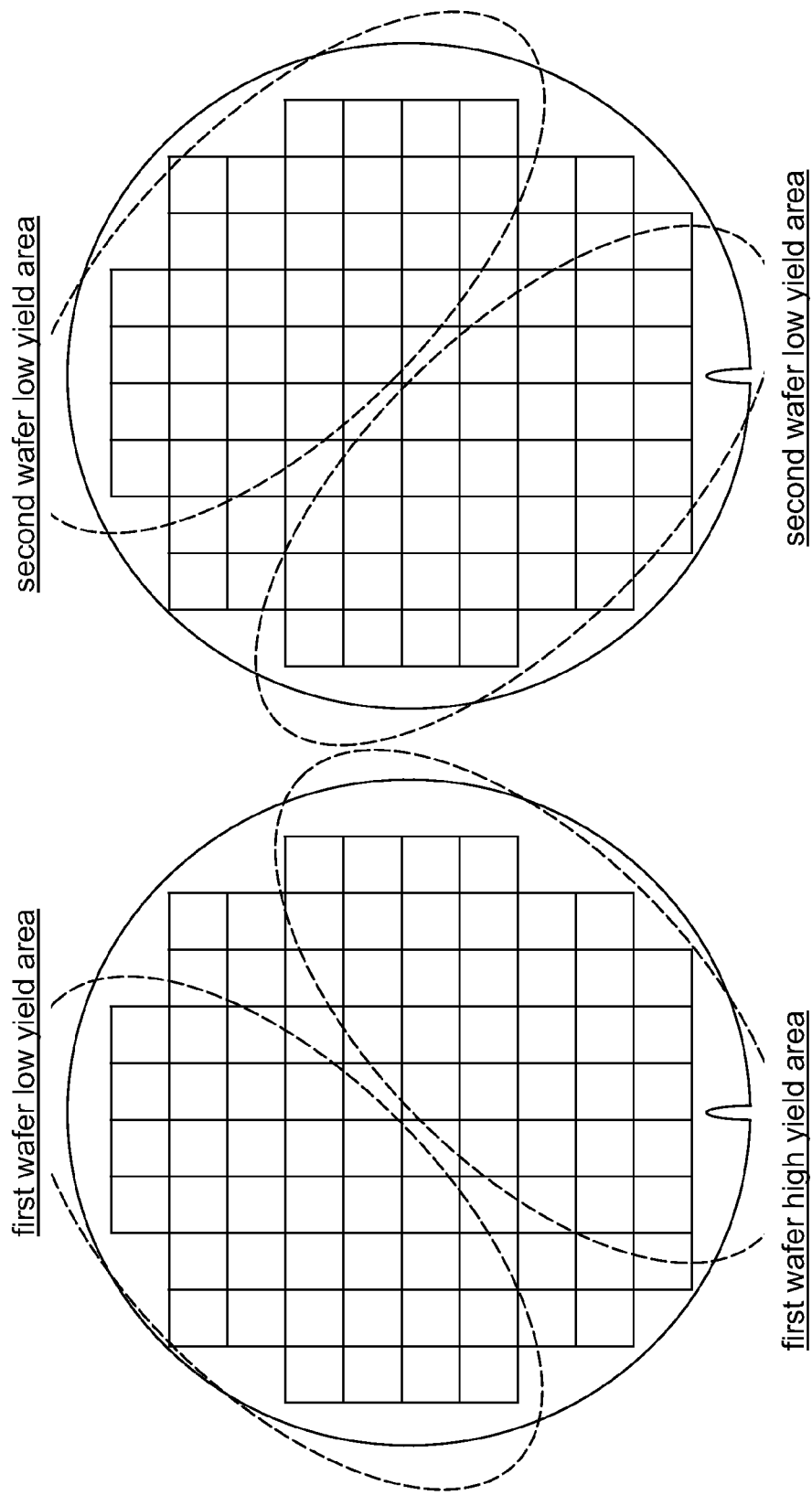
FIG. 1 is a schematic top down view of a prior art structure.

As stated above, the present invention relates to a method of testing semiconductor chips in multiple stacked configurations with different rotational interconnections, which are now described in detail with accompanying figures. Throughout the drawings, the same reference numerals or letters are used to designate like or equivalent elements. The drawings are not necessarily drawn to scale.

As used herein, an "interposer" is a structure designed to be inserted between a first substrate and second substrate to enable testing of a functionality that depends on a component in the first substrate and another component in the second substrate.

As used herein, a "stacked chip yield" is a yield of a combination of chips that can be stacked with vertical electrical connections therebetween.

Figure 2:
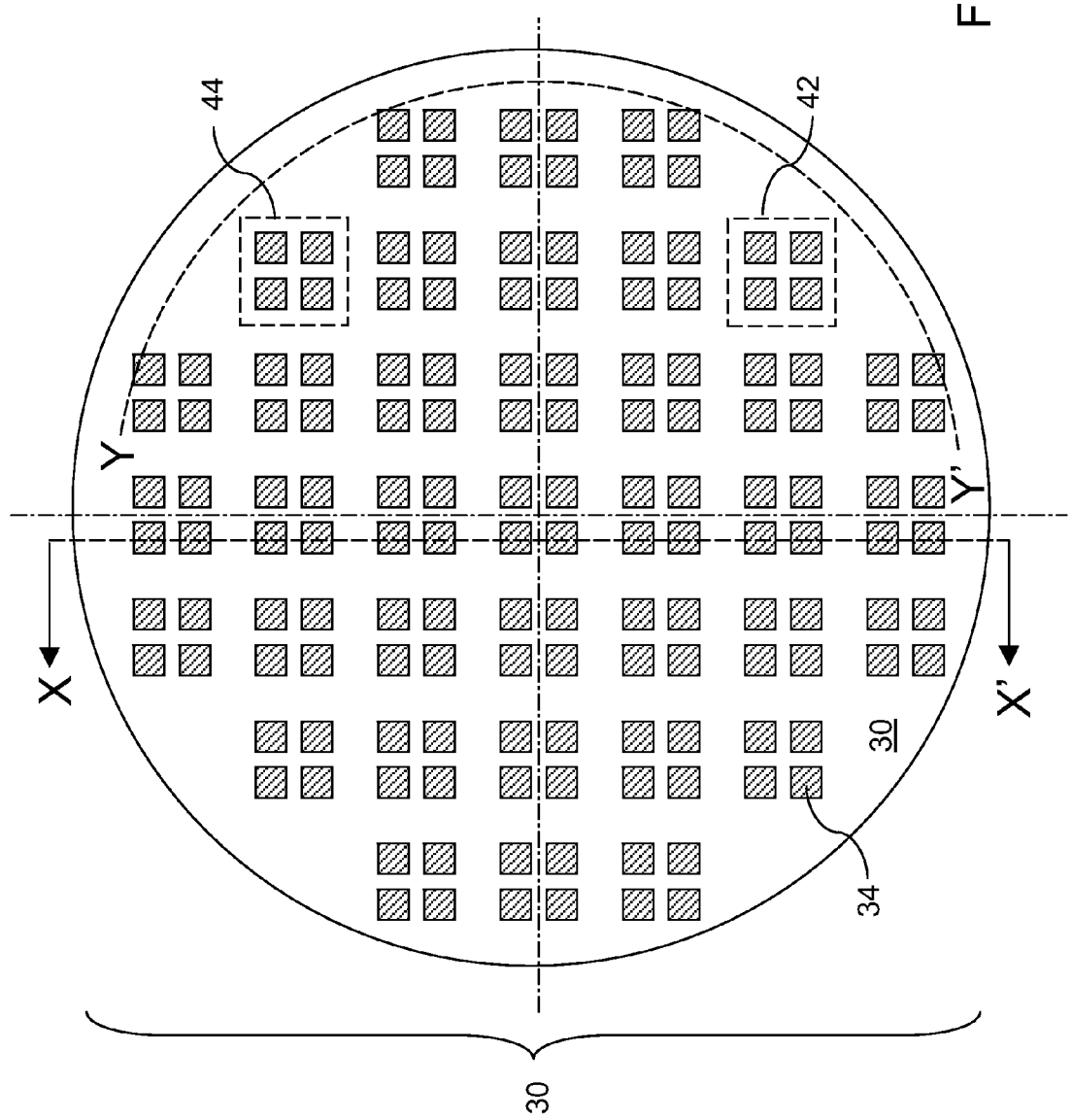
FIG. 2 is a top-down view of a first exemplary structure according to a first embodiment of the present invention. A second substrate is not shown for clarity.

FIGS. 2-4 are various views of a first exemplary structure according to a first embodiment of the present invention. The first exemplary structure includes a vertical stack, from bottom to top, of a first substrate 10, an interposer 30, and a second substrate 20. FIG. 2 is a top-down view of the first exemplary structure in which the second substrate 20 is not shown for clarity. FIG. 3 is a vertical cross-sectional view of the first exemplary structure along a flat vertical plane X-X' shown in FIG. 2. FIG. 3 is a vertical cross-sectional view of the first exemplary structure along a curved vertical plane Y-Y' shown in FIG. 2.

The first exemplary structure enables testing of a functionality that requires operation of a component in the first substrate 10 and another component in the second substrate 20 by providing electrical connections between the first substrate 10 and the second substrate 20 in the interposer 30. The interposer 30 enables testing of the combination of the first substrate 10 and the second substrate 20 without bonding the first and second substrates (10, 20) permanently, for example, by C4 bonding. The first exemplary structure can be loaded into a tester (not shown) that runs a test program to determine the functionality of the combined components across the first and second substrates (10, 20). The interposer 30 can include contact points (not shown) to enable electrical connections between the interposer and a test card or other component of the tester. The interface between the interposer 30 and the first substrate 10 is marked with "A," and the interface between the interposer 30 and the second substrate 20 is marked with "B."

In case the first and second substrates (10, 20) are semiconductor substrates including semiconductor chips, the diameter of the first and second substrates (10, 20) can be from 100 mm to 300 mm, and the thickness of the first and second substrates (10, 20) can be from 500 microns to 1,000 microns, although lesser and greater diameters and thicknesses can also be employed. The area of the interposer 30 typically matches the areas of the first and second substrates (10, 20). The thickness of the interposer 30 can be from 1 mm to 30 mm, although lesser and greater thicknesses can also be employed.

The first substrate 10 includes first semiconductor chips (not shown) that are patterned with an N-fold rotational symmetry. N is any positive integer greater than 1. For example, N can be 2, 3, 4, 5, or 6. The second substrate 20 includes second semiconductor chips (not shown) that are patterned with an N-fold rotational symmetry. N is 4 in the first exemplary structure illustrated in FIGS. 2-4.

Each first semiconductor chip includes first conductive structures (not shown) that are configured to provide electrical contact to the functional components within the first semiconductor chip. The first conductive structures can be metal pads or C4 structures. The first conductive structures are present on the upper surface of the first substrate 10, i.e., on the surface facing the interposer 30. Likewise, each second semiconductor chip includes second conductive structures (not shown) that are configured to provide electrical contact to the functional components within the second semiconductor chip. The second conductive structures can be metal pads or C4 structures. The first conductive structures are present on the upper surface of the second substrate 20, which is the surface that faces the interposer 30 when the second substrate 20 is placed upside down on the interposer 30.

The interposer 30 includes an interposer substrate 31, a set of lower pads 32 configured to contact first conductive structures located on first semiconductor chips in the first substrate 10, a set of upper pads 34 configured to contact second conductive structures located on second semiconductor chips in the second substrate 20. The interposer substrate 31 can be an insulator substrate or a semiconductor substrate. A plurality of metal lines 36 embedded in the interposer substrate 31 provides electrical connections in a horizontal plane of the interposer 30. A plurality of metal vias 38 embedded in the interposer substrate 31 provides electrical connections in a vertical direction of the interposer 30. The interposer substrate 31 includes a dielectric material that provides electrical isolation among metal lines 36 and metal vias 38 that are not electrically shorted thereamongst.

The first conductive structures on each first semiconductor chip can include test pads. The second conductive structure on each second semiconductor chip can include test pads. The set of lower pads 32 and the set of upper pads 34, the test pads on first semiconductor chips, and the test pads on second semiconductor chips can have the same pitch and spacing to facilitate electrical contacts among the interposer 30, the first substrate 10, and the second substrate 20.

The interposer 30 provides electrical interconnections between the first substrate 10 and the second substrate 20 with a rotational angle of $(i-1)/N \times 2\pi$, in which i can be any integer from 1 to N. If N is 4, the rotational angle can be 0 degree, 90 degrees, 180 degrees, or 270 degrees. Thus, the interposer 30 can electrically connects a chip among the first semiconductor chips, which is herein referred to as a "first selected chip," to a chip among the second semiconductor chips, which is herein referred to as a "second selected chip." The first selected chip is located in a first area 42 of the first substrate 10, and the second selected chip is located in a second area 44 of a second substrate 20. The second area 44 corresponds to an area that is rotated from the first area 42 by an angle of $(i-1)/N \times 2\pi$ about a center axis of the first substrate 10, in which the integer i can be any integer from 1 to N.

Each of the lower pads 32 is electrically connected to one of the upper pads 34 by electrical wiring embedded in the interposer 30 such that each of the test pads on the first selected chip in the first substrate 10 is electrically connected to a corresponding test pad on the second selected chip in the second substrate 20. The electrical connection provided by the interposer 30 is the same type of electrical connection that would be provided if the first selected chip is bonded to the second selected chip directly. If the rotational angle is zero, the electrical connection provided by the interposer 30 is the equivalent of the electrical connection enabled by direct bonding of the first substrate 10 and the second substrate 20 without a relative rotation therebetween. In general, for a rotational angle of $(i-1)/N \times 2\pi$, the electrical connection provided by the interposer 30 is the equivalent of the electrical connection enabled by direct bonding of the first substrate 10 and the second substrate with a relative rotation therebetween by the rotational angle of $(i-1)/N \times 2\pi$. The interposer 30 can have an N-fold rotational symmetry around a center axis thereof.

Thus, testing the first exemplary structure in a tester is functionally equivalent to bonding the first and second substrates (10, 20) with a rotational angle of $(i-1)/N \times 2\pi$ introduced during alignment and prior to bonding. However, use of the interposer 30 does not permanently bond the first and second substrates (10, 20) or introduce any permanent structural damage associated with dissociating a bonded pair of substrates.

If each of the first and second substrates (10, 20) has an N-fold rotational symmetry, the interposer 30 can be designed to have a corresponding N-fold rotational symmetry.

Figure 5:
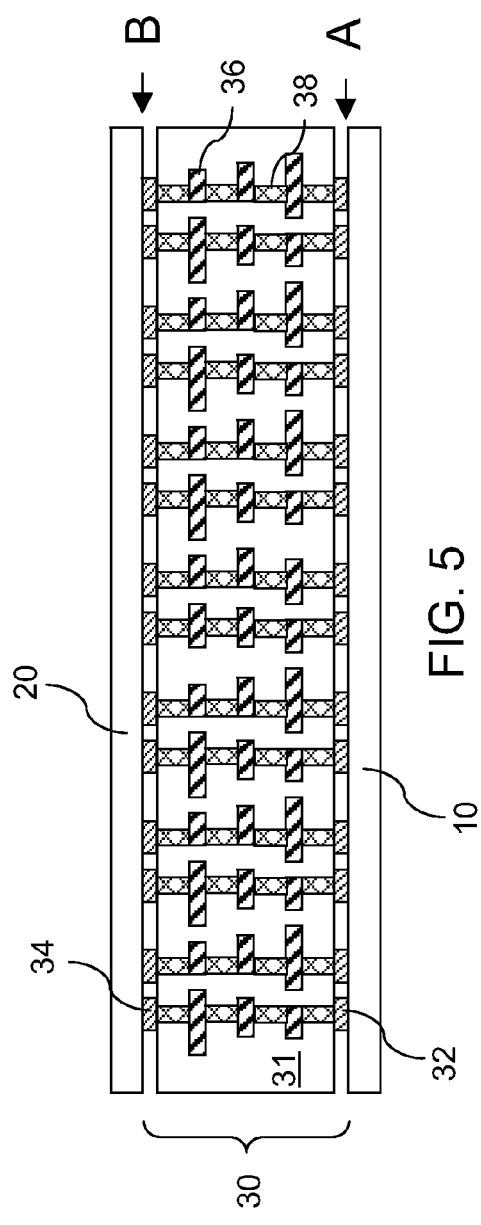
FIG. 5 is a vertical cross-sectional view of a second exemplary structure along the plane corresponding to the plane X-X' in FIG. 2 according to the first embodiment of the present invention.
Figure 6:
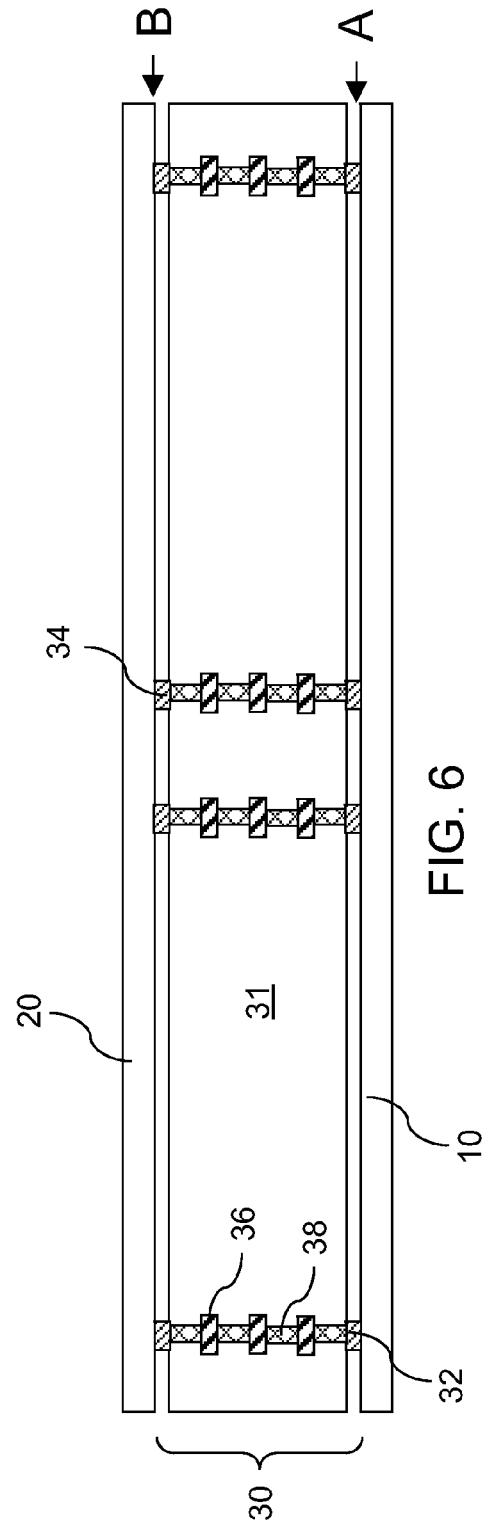
FIG. 6 is a vertical cross-sectional view of the second exemplary structure along a curved plane corresponding to the plane Y-Y' in FIG. 2 according to the first embodiment of the present invention.

Referring to FIGS. 5 and 6, a second exemplary structure according to the first embodiment of the present invention includes a vertical stack, from bottom to top, of a first substrate 10, an interposer 30, and a second substrate 20. The rotational angle for the interposer 30 is zero, i.e., the interposer 30 connects the first and second substrates (10, 20) without rotation. In the case of the interposer 30, each second selected chip overlies a corresponding first selected chip. Each second selected chip is electrically connected to the corresponding first selected chip through the metal lines 36 and metal vias 38. If each of the first and second substrates (10, 20) has an N-fold rotational symmetry, the interposer 30 can be designed with a corresponding N-fold rotational symmetry. The interface between the interposer 30 and the first substrate 10 is marked with "A," and the interface between the interposer 30 and the second substrate 20 is marked with "B."

Figure 7:
FIG. 7 is a schematic view of a set of N interposers according to the first embodiment of the present invention.

Referring to FIG. 7, a set of N interposers can be employed to test the combination of the first and second substrates (10, 20; See FIGS. 3-6) at N different rotational alignment configurations. Specifically, an i-th interposer provides a rotational angle of $(i-1)/N \times 2\pi$ between the first and second substrates (10, 20). Among the set of N interposers, an i-th interposer electrically connects a first selected chip located in a first area 42 (See FIG. 2) of the first substrate 10 to a second selected chip in a second area 44 (See FIG. 2) of the second substrate 20. The second area 44 corresponds to an area that is rotated from the first area 42 by an angle of $(i-1)/N \times 2\pi$ about a center axis of the first substrate 10 for each integer value of i from 1 to N. N can be any integer greater than 1. For example, N can be 2, 3, 4, 5, or 6.

In this case, a tester can be configured to hold an assembly of the first substrate 10, the second substrate 20, and any one of the set of N interposers and to test a functionality of a combination of the first selected chip and the second selected chip for each of the set of N interposers. The i-th interposer can includes a set of lower pads 32 (See FIGS. 3-6) that are configured to contact first conductive structures located on the first selected chip in the first substrate 10 and a set of upper pads 34 (See FIGS. 2-6) that are configured to contact second conductive structures located on the second selected chip in the second substrate 20 for each integer value of i from 1 to N. Each of the lower pads 32 is electrically connected to one of the upper pads 34 by electrical wiring embedded in the i-th interposer. Each of the set of N interposers can have an N-fold rotational symmetry around a center axis thereof.

The tester can be configured to test the first and second substrates (10, 20) by employing each of the set of N interposers sequentially. Further, the tester can be programmed to determine the composite yield of stacked chips at each rotational angle that corresponds to each of the set of N interposers so that the rotational angle that provides the highest stacked chip yield can be determined upon completion of the test on the first and second substrates (10, 20).

Figure 8:
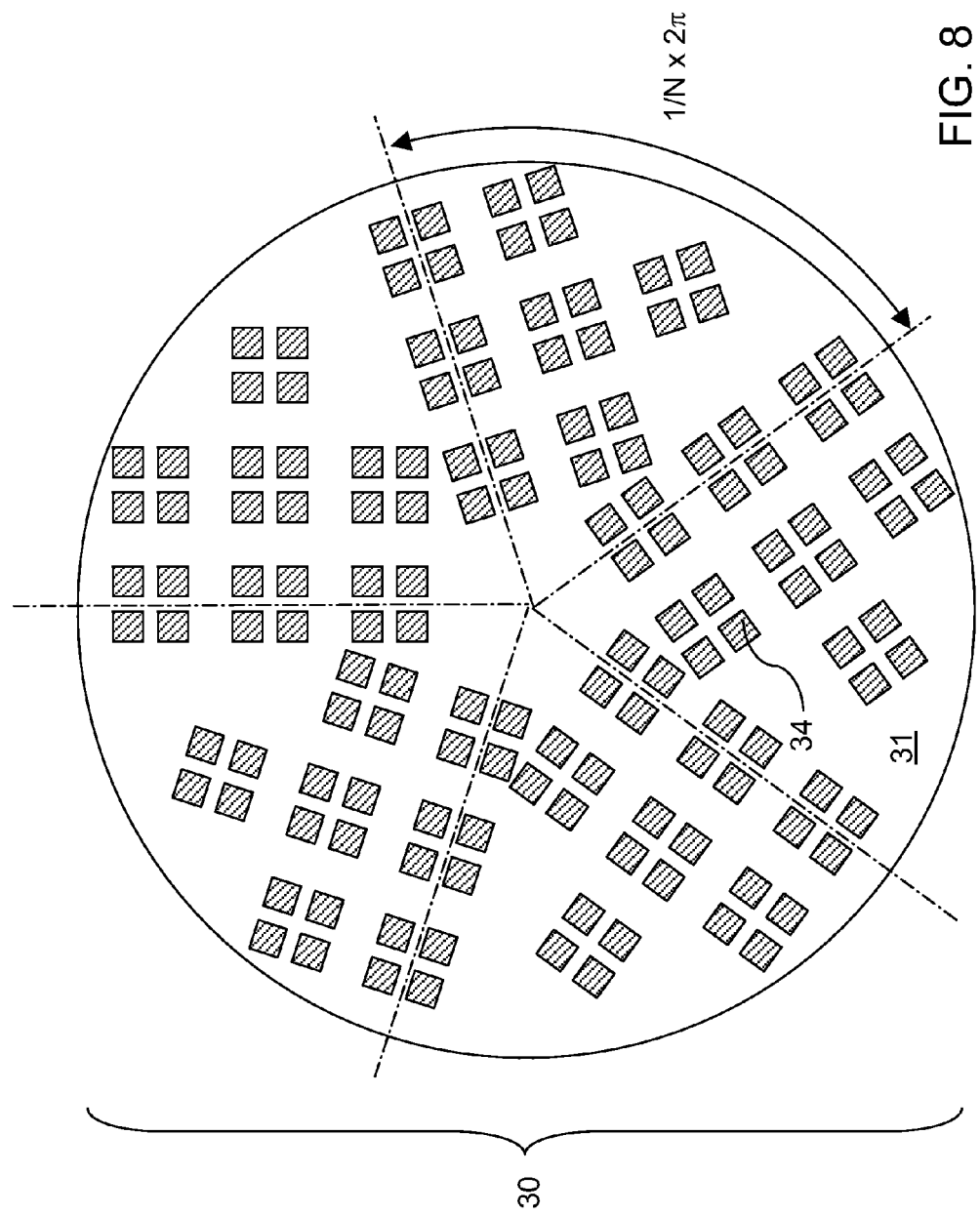
FIG. 8 is a top-down view of an exemplary interposer according to the first embodiment of the present invention.

Referring to FIG. 8 is a top-down view of an exemplary interposer having a fivefold rotational symmetry according to the first embodiment of the present invention. In general, N can be any integer equal to or greater than 2. The rotational symmetry of an interposer matches the rotational symmetry in the first and second substrates to be tested with the interposer.

Figure 9:
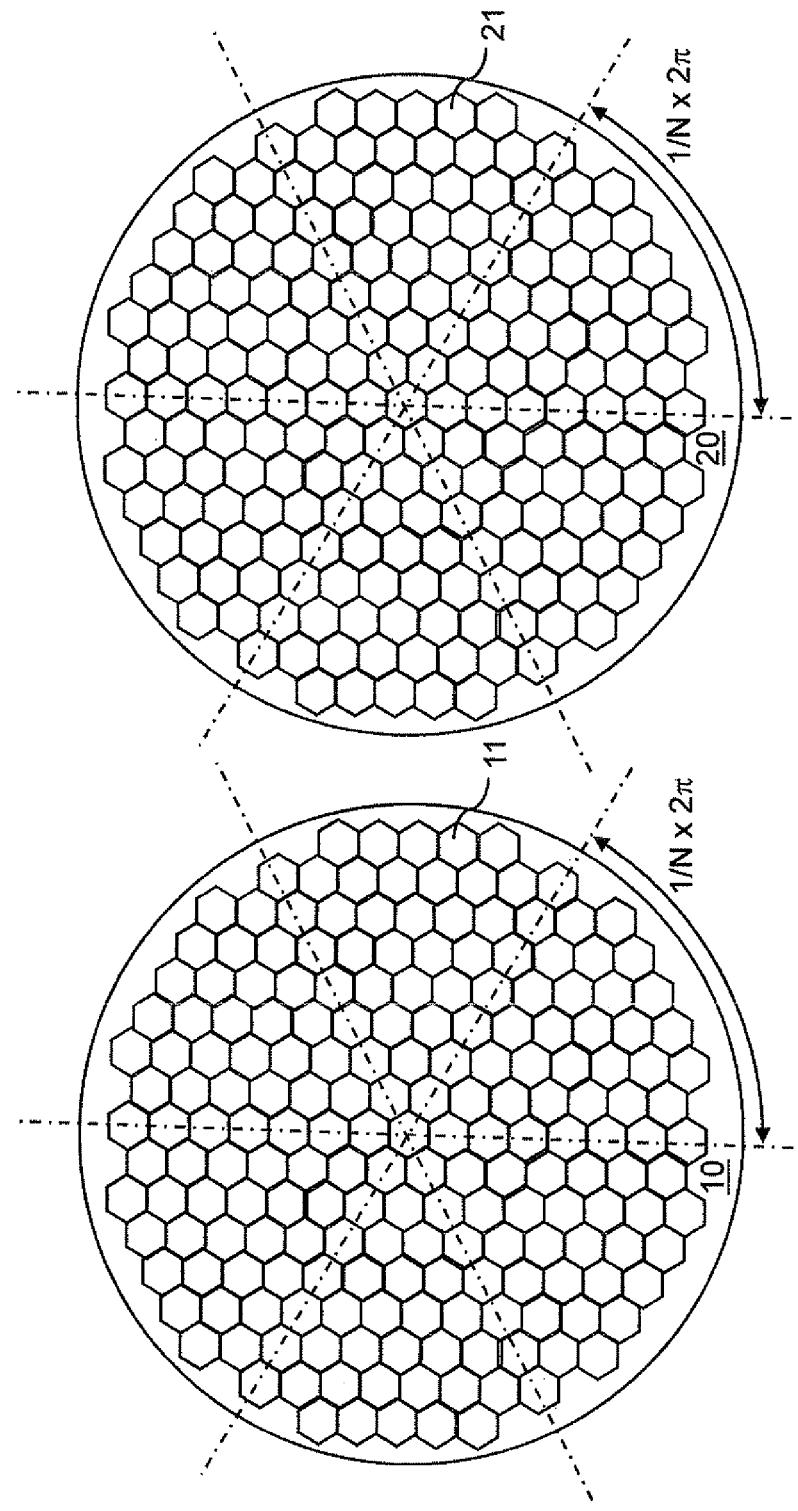
FIG. 9 shows top-down views of a first substrate 10 including an array of first semiconductor chips 11 and a second substrate 20 including an array of second semiconductor chips 21.

Referring to FIG. 9, a set of a first substrate 10 and a second substrate 20 that can be employed in the present invention is shown. The first substrate 10 can include an array of first semiconductor chips 11, and the second substrate 20 can include an array of second semiconductor chips 21. Not necessarily but preferably, the first substrate 10 and the second substrate 20 can be selected to have the same N-fold rotational symmetry around a center of each substrate (10, 20). In general, N can be any integer equal to or greater than 2.

Optionally, each of the first semiconductor chips 11 can have a rotationally symmetric shape. Likewise, each of the second semiconductor chips 21 can have a rotationally symmetric shape. Rotational symmetry built into the first and/or second semiconductor chips (11, 21) can enhance bonding yield in case lithographic overlay offset is present during alignment in a semiconductor chip or an interposer. The first substrate 10 and/or the second substrate 20 are not required to be diced to chip level. The first substrate 10 or the second substrate 20 can be rotated by an angle that is an integer multiple of $2\pi/N$ to provide highest available yield upon bonding. Further, additional advantages can be provided by allowing rotation of a semiconductor chip during a die-to-die bonding or a die-to-wafer bonding in addition to a wafer-to-wafer bonding.

Figure 10:
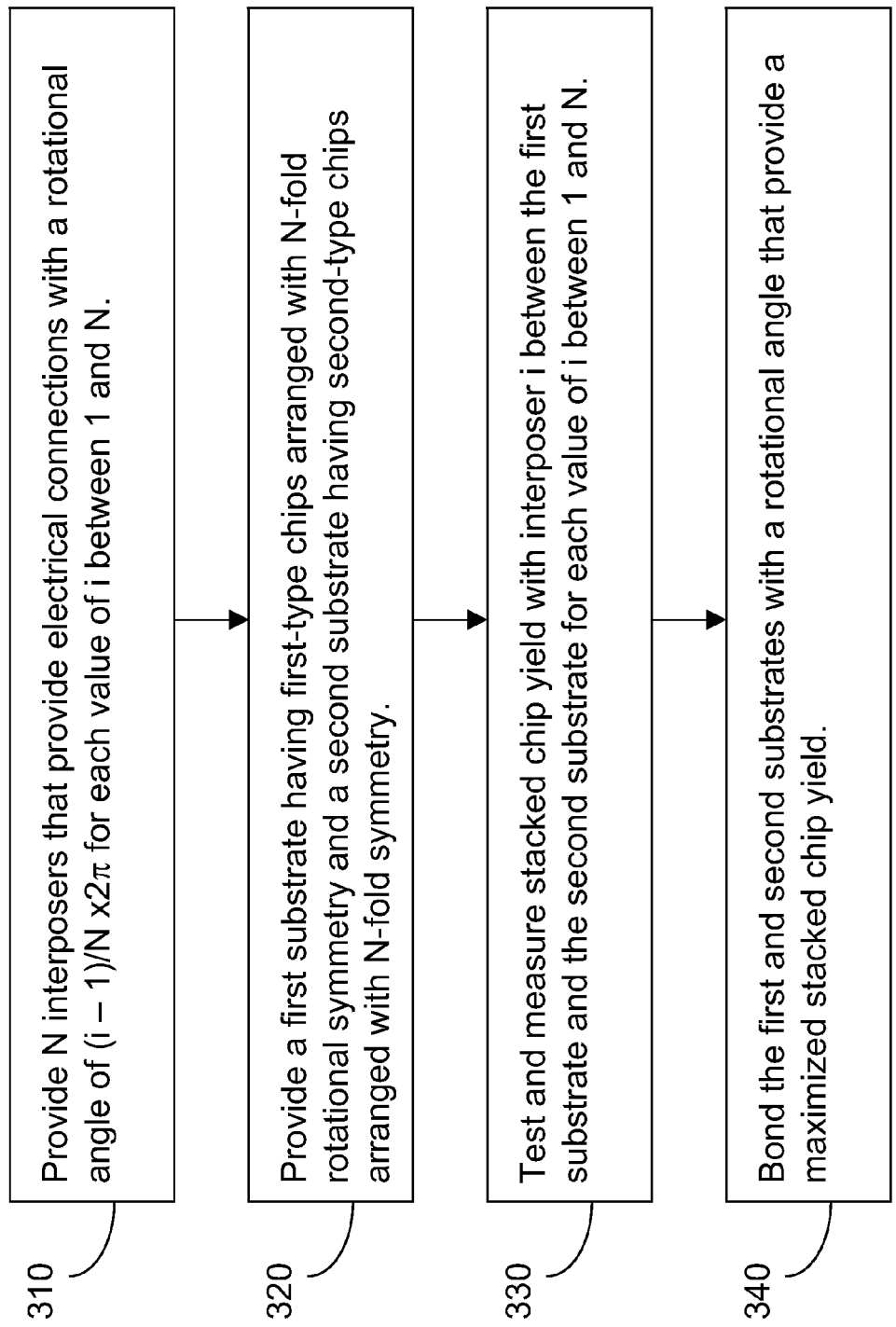
FIG. 10 is a flow chart of processing steps according to the first embodiment of the present invention.

Referring to FIG. 10, a flow chart illustrates processing steps according to the first embodiment of the present invention. Referring to step 310, a set of N interposers is provided as illustrated in FIG. 7. N is an integer greater than 1. The set of N interposers can include i-th interposers, in which i is an integer from 1 to N. The N interposers provide electrical connections with a rotational angle of $(i-1)/N \times 2\pi$ for each value of i from 1 to N. Each of the N interposers can have an N-fold rotational symmetry around a center axis thereof.

Referring to step 320, a first substrate including first semiconductor chips and a second substrate including second semiconductor chips are provided. The first semiconductor chips are arranged to have an N-fold rotational symmetry around a center axis of the first substrate. The second semiconductor chips are arranged to have an N-fold rotational symmetry around a center axis of the second substrate. Further, the first and second substrates are designed to be bondable to form a plurality of stacked chips having a functionality that is not provided by chips in the first substrate alone or by chips in the second substrate alone.

Referring to step 330, all combinations of a first selected chip and a second selected chip electrically connected by each of the N interposers tested. The testing can be performed by forming N different assemblies of the first substrate, the second substrate, and the i-th interposer for each value of i from 1 to N. For each assembly including an i-th interposer, all possible combinations of a first selected chip and a second selected chip electrically connected by the i-th interposer are tested. A first selected chip is selected from the first semiconductor chips in the first substrate, and a second selected chip is selected from the second semiconductor chips in the second substrate. The second selected chip is located in a second area that is rotated from a first area of the first selected chip by an angle of $(i-1)/N \times 2\pi$ about a center axis of the first substrate for each of the i-th interposers.

The testing determines stacked chip yield on a functionality that depends on both the first selected chip and the second selected chip. After testing the first and second substrates with the set of N interposers, a rotational angle associated with an interposer that provides a maximum stacked chip yield on the testing is determined.

Referring to step 340, the first and second substrates are bonded at a rotational angle that provide the maximized stacked chip yield. Thus, depression in chip yield at different regions of first and second substrates to be bonded can be alleviated by testing the first and second substrates with the N interposers and subsequently selecting the rotational angle that maximizes the stacked chip yield from the first and second substrates.

Figure 11:
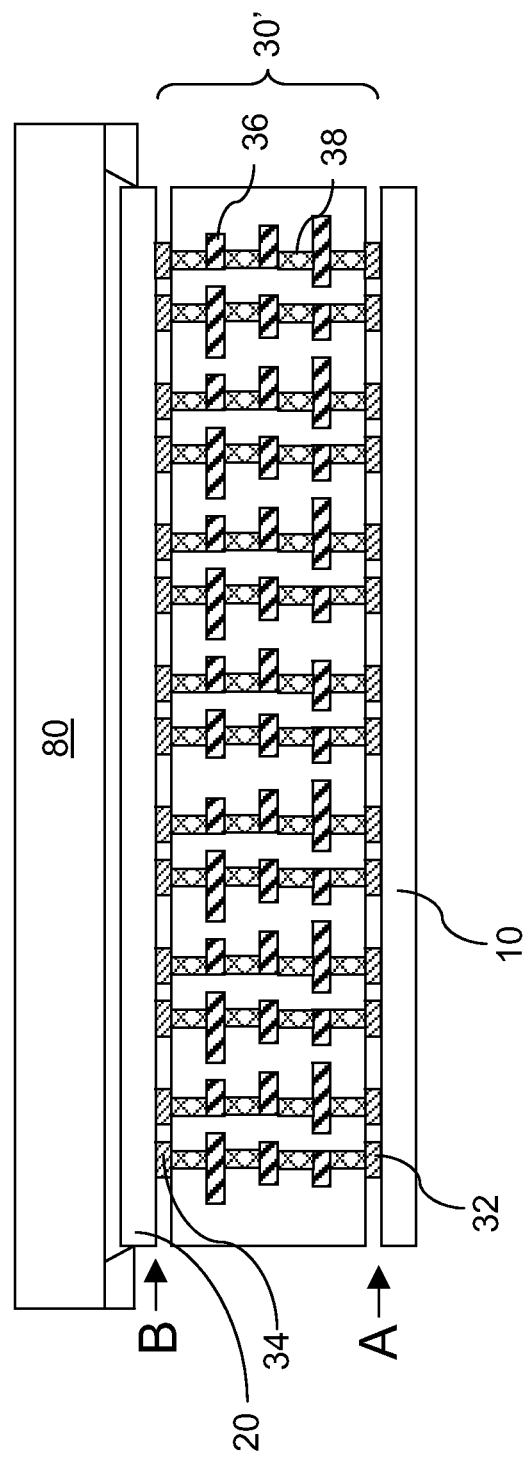
FIG. 11 is a vertical cross-sectional view of an exemplary structure according to a second embodiment of the present invention.

Referring to FIG. 11, an exemplary structure according to a second embodiment of the present invention includes an assembly, i.e., a vertical stack, from bottom to top, of a first substrate 10, an interposer 30', a second substrate 20, and a rotational assembly 80 that is configured to rotate the second substrate 20 is located above the second substrate 20. The exemplary structure can be loaded into a tester to test the functionality of the combination of the first and second substrates (10, 20) in the same manner as in the first embodiment.

The interposer 30' can be an interposer that does not provide any rotation in the electrical connections between the first and second substrates (10, 20). In this case, the interposer 30' of the second embodiment can be the same as the interposer 30 in FIGS. 5 and 6, for which the rotational angle is zero. Alternately, the interposer 30' can be any one of the interposers that provide electrical connections with a rotational angle of $(i-1)/N \times 2\pi$ in which N is an integer greater than 1, and i is an integer from 2 to N. For example, N can be 2, 3, 4, 5, or 6. In this case, the interposer 30' of the second embodiment can the interposer 30 illustrated in FIGS. 2-4. Only one interposer 30' is required in the second embodiment of the present invention.

As in the first embodiment, the first substrate 10 includes first semiconductor chips, and the second substrate 20 includes second semiconductor chips. The first semiconductor chips are arranged to have an N-fold rotational symmetry around a center axis of the first substrate. The second semiconductor chips are arranged to have an N-fold rotational symmetry around a center axis of the second substrate. Further, the first and second substrates are designed to be bondable to form a plurality of stacked chips having a functionality that is not provided by chips in the first substrate alone or by chips in the second substrate alone.

The exemplary structure can be incorporated into an apparatus for testing substrates in multiple configurations. The multiple configurations are provided by the rotational assembly 80, which is configured to rotate the second substrate 20 by an angle of $1/N \times 2\pi$ about a center axis of the second substrate 20 at least (N−1) times. Thus, N different azimuthal angles for the second substrate 20 are obtained by rotating the second substrate 20.

The tester is configured to hold an assembly of the first substrate 10, the second substrate 20, and the interposer 30' therebetween and to test a functionality of a combination of a first selected chip located in a first area of a first substrate and a second selected chip in a second area of a second substrate. The second selected chip overlies the first selected chip. In an alternative configuration in which the first substrate 10 is located above the second substrate 20, the second selected chip underlies the first selected chip.

The interposer 30' includes a set of lower pads 32 that are configured to contact first conductive structures located on the first selected chip and a set of upper pads 34 that are configured to contact second conductive structures located on the second selected chip. Each of the lower pads 32 is electrically connected to one of the upper pads 34 by electrical wiring embedded in the interposer. As in the first embodiment, the set of lower pads 32, the set of upper pads, test pads on the first selected chip, and test pads on the second selected chip can have the same pitch and spacing to facilitate testing and subsequent bonding between the first and second substrates (10, 20).

Figure 12:
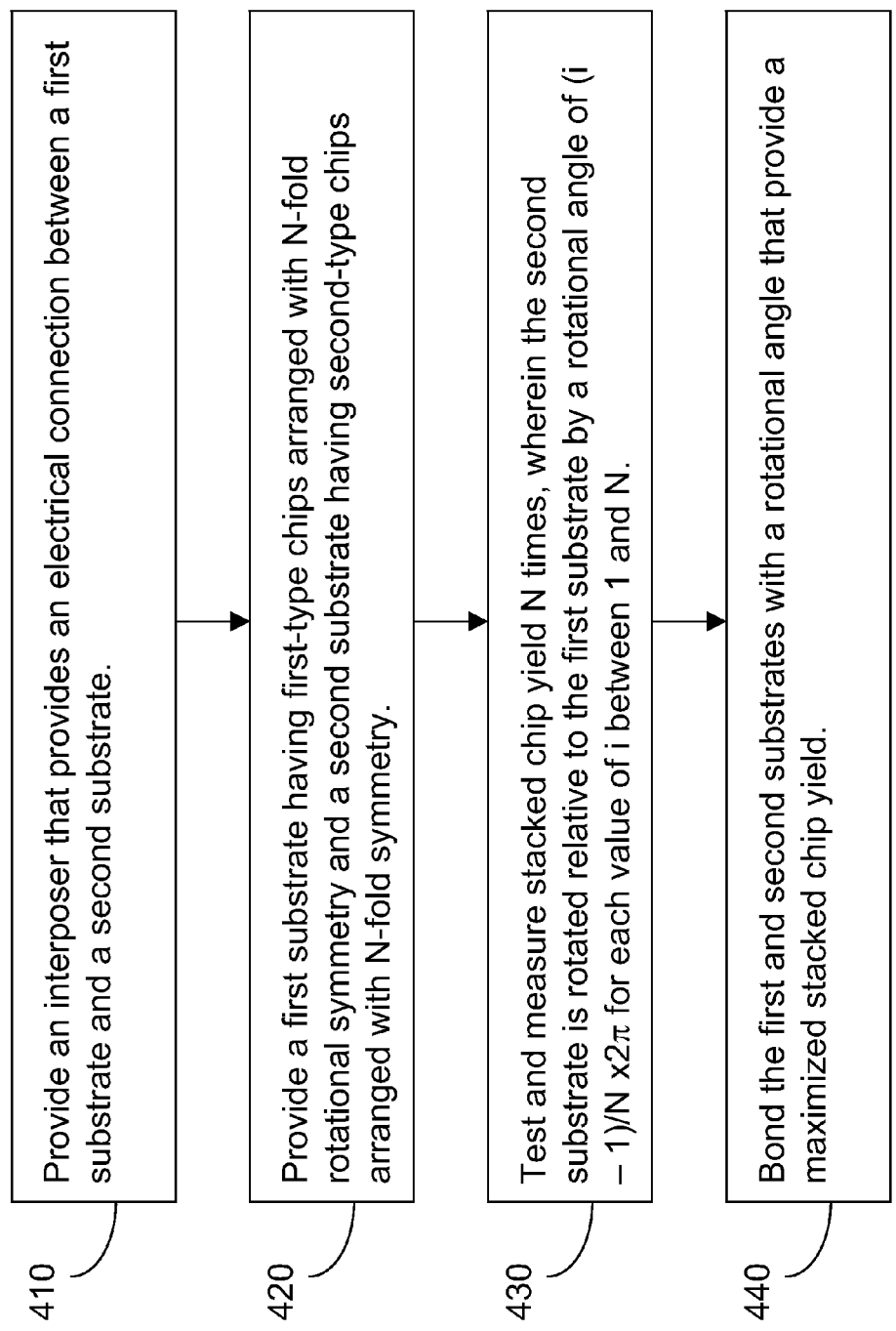
FIG. 12 is a flow chart of processing steps according to the second embodiment of the present invention.

FIG. 12 a flow chart illustrates processing steps according to the second embodiment of the present invention. Referring to step 410, an interposer is provided, which provides electrical connections between a first substrate and a second substrate. The interposer may provide electrical connections between the first and second substrates without any rotation between the first and second substrates, or may provide electrical connections between the first and second substrates with a rotational angle of $(i-1)/N \times 2\pi$ in which N is an integer greater than 1, and i is an integer from 2 and N.

Referring to step 420, a first substrate including first semiconductor chips and a second substrate including second semiconductor chips are provided. The first semiconductor chips are arranged to have an N-fold rotational symmetry around a center axis of the first substrate. The second semiconductor chips are arranged to have an N-fold rotational symmetry around a center axis of the second substrate. Further, the first and second substrates are designed to be bondable to form a plurality of stacked chips having a functionality that is not provided by chips in the first substrate alone or by chips in the second substrate alone.

Referring to step 430, the assembly of the first substrate, the second substrate, and the interposer therebetween is tested in the original configuration, which is herein referred to as a "first configuration," to determine a functionality for all combinations of a first selected chip and a second selected chip electrically connected by the interposer. Upon completion of testing in the first configuration, the second substrate is rotated by an angle of $1/N \times 2\pi$ about a center axis of the second substrate. The rotation of the second substrate can be effected by the rotational assembly. Upon completion of testing in the second configuration, the second substrate is rotated by an angle of 1/N×2π about a center axis of the second substrate once again for testing of assembly in the next configuration if N is greater than 2.

In general, the combination of rotation and additional testing is repeated (N−1) times after testing in the first configuration. Each rotation can be effected at a rotational angle of 1/N×2π about a center axis of the second substrate by the rotational assembly. For each configuration of the assembly having a different rotational angle between the first and second substrates, all possible combinations of a first selected chip and a second selected chip electrically connected by the interposer are tested. A first selected chip is selected from the first semiconductor chips in the first substrate, and a second selected chip is selected from the second semiconductor chips in the second substrate. The second selected chip overlies or underlies the first selected chip.

The testing determines stacked chip yield on a functionality that depends on both the first selected chip and the second selected chip. After testing the first and second substrates at N different configurations corresponding to N different rotational angles between the first and second substrates, the rotational angle that provides a maximum stacked chip yield on the testing is determined.

Referring to step 440, the first and second substrates are bonded at the rotational angle that provides the maximized stacked chip yield. As in the first embodiment, depression in chip yield at different regions of first and second substrates to be bonded can be alleviated by testing the first and second substrates at N different configurations having different rotational angles between the first and second substrates, and subsequently selecting the rotational angle that maximizes the stacked chip yield of the first and second substrates.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. An apparatus for testing substrates in multiple configurations, said apparatus comprising:
a tester configured to hold an assembly of a first substrate, a second substrate, and an interposer therebetween and to test a functionality of a combination of a first selected chip located in a first area of a first substrate and a second selected chip in a second area of a second substrate, wherein said second selected chip overlies or underlies said first selected chip; and
a rotational assembly that is configured to rotate said second substrate by an angle of 1/N×2π about a center axis of said second substrate at least (N−1) times, wherein N is an integer greater than 1.

2. The apparatus of claim 1, wherein said interposer includes a set of lower pads configured to contact first conductive structures located on said first selected chip and a set of upper pads configured to contact second conductive structures located on said second selected chip.

3. The apparatus of claim 2, wherein each of said lower pads is electrically connected to one of said upper pads by electrical wiring embedded in said interposer.

4. The apparatus of claim 2, wherein said set of lower pads, said set of upper pads, test pads on said first selected chip, and test pads on said second selected chip have a same pitch and a same spacing.

5. The apparatus of claim 1, wherein said interposer does not provide any rotation in electrical connections between said first and second substrates.

6. The apparatus of claim 1, wherein said interposer provides a rotation in electrical corrections between said first and second substrates by a rotational angle of (i−1)/N×2π, wherein N is an integer greater than 1 and not greater than N.

7. The apparatus of claim 1, further comprising means for determining a configuration that provides a maximum stack chip yield among multiple stacked chip yields on a functionality that depends on both said first selected chip and said second selected chip, wherein said stacked chip yields are determined at N different configurations of said assembly corresponding to N different rotational angles between said first substrate and said second substrate.

8. The apparatus of claim 1, wherein said N is selected from 2, 3, 4, 5, and 6.

9. A method of manipulating substrates in multiple configurations, said method including:
testing an assembly of a first substrate, a second substrate, and an interposer therebetween and to test a functionality of a combination of a first selected chip located in a first area of a first substrate and a second selected chip in a second area of a second substrate, wherein said second selected chip overlies or underlies said first selected chip;
rotating said second substrate by an angle of 1/N×2π about a center axis of said second substrate (N−1) times; and
repeating said testing of said assembly of said first substrate, said second substrate, and said interposer after each rotation of said second substrate.

10. The method of claim 9, further comprising determining a maximum-yield rotational angle between said first and second substrates, wherein test yield on said assembly is at a maximum when said first and second substrate are rotated by said maximum stacked chip yield rotational angle.

11. The method of claim 9, wherein said testing of said assembly and said repetition of said testing are performed employing an apparatus comprising a tester and a rotational assembly, wherein said tester configured to hold said assembly, and said rotational assembly is configured to rotate said second substrate.

12. The method of claim 9, wherein said interposer includes a set of lower pads configured to contact first conductive structures located on said first selected chip and a set of upper pads configured to contact second conductive structures located on said second selected chip.

13. The method of claim 12, wherein each of said lower pads is electrically connected to one of said upper pads by electrical wiring embedded in said interposer.

14. The method of claim 12, wherein said set of lower pads, said set of upper pads, test pads on said first selected chip, and test pads on said second selected chip have a same pitch and a same spacing.

15. The method of claim 9, wherein said interposer does not provide any rotation in electrical connections between said first and second substrates.

16. The method of claim 9, wherein said interposer provides a rotation in electrical corrections between said first and second substrates by a rotational angle of (i−1)/N×2π, wherein N is an integer greater than 1 and not greater than N.

17. The method of claim 9, wherein said first substrate includes first semiconductor chips that include said first selected chip, and said second substrate includes second semiconductor chips that include said second selected chip, wherein said first semiconductor chips are arranged to have an N-fold rotational symmetry around a center axis of said first substrate, and said second semiconductor chips are arranged to have an N-fold rotational symmetry around said center axis of said second substrate.

18. The method of claim 9, wherein said first substrate and said second substrate are configured to be bondable to form a plurality of stacked chips having a functionality that is not provided by chips in said first substrate alone or by chips in said second substrate alone.

19. The method of claim 9, further comprising bonding said first substrate and said second substrate in a configuration at a rotational angle that provides a maximized stacked chip yield.

20. The method of claim 9, wherein said N is selected from 2, 3, 4, 5, and 6.

* * * * *